United States Patent [19]

Nakamura et al.

[11] Patent Number: 5,037,782
[45] Date of Patent: Aug. 6, 1991

[54] METHOD OF MAKING A SEMICONDUCTOR DEVICE INCLUDING VIA HOLES

[75] Inventors: Taeko Nakamura; Yutaka Yoshii, both of Itami, Japan

[73] Assignee: Mitsubishi Denki Kabushiki Kaisha, Japan

[21] Appl. No.: 376,014

[22] Filed: Jul. 6, 1989

[30] Foreign Application Priority Data

Mar. 29, 1989 [JP] Japan .................................. 1-79226

[51] Int. Cl.⁵ ...................... H01L 21/00; H01L 21/02; H01L 29/80; H01L 29/44
[52] U.S. Cl. .................................. 437/902; 437/974; 148/DIG. 135; 357/55
[58] Field of Search .................. 437/86, 90, 170, 203, 437/902, 974; 148/DIG. 50, DIG. 135; 357/15, 22, 55, 68, 71

[56] References Cited

U.S. PATENT DOCUMENTS

| | | | |
|---|---|---|---|
| 4,707,726 | 11/1987 | Tinder | 357/80 |
| 4,733,195 | 3/1988 | Tserng | 330/286 |
| 4,751,562 | 6/1988 | Yamamura | 357/51 |
| 4,794,093 | 12/1988 | Tong et al. | 437/902 |
| 4,800,420 | 1/1989 | Chen et al. | 357/76 |
| 4,807,022 | 2/1989 | Kazior et al. | 437/902 |

FOREIGN PATENT DOCUMENTS

| | | |
|---|---|---|
| 0031253 | 2/1985 | Japan . |
| 0122278 | 6/1987 | Japan . |
| 0211962 | 9/1987 | Japan . |
| 0131555 | 6/1988 | Japan . |
| 0155673 | 6/1988 | Japan . |
| 0178755 | 10/1988 | Japan . |

OTHER PUBLICATIONS

Mitsui, K., "Via-Hole Structured GaAs High Output Monolithic Amplifier," 1983, Nat. Conf. of Semi and Mat., IEEE, p. 122.
Hirachi, Y., "a Packaged 20-GHZ 1-W GaAs MESFET with a Novel Via-Hole Plated Heat Sink Structure," IEEE Trans. Micro Theory & Tech, vol. MTT-32, No. 3, Mar. 3, 1984, pp. 309-316.
Hirachi, Y., a Novel Via Hole PHS Structure in K--Band Powers GaAs FET, IEEE, New York, U.S.A., pp. 676-679, 1981, Int. Elect. Dev. Meeting.

Primary Examiner—Brian E. Hearn
Assistant Examiner—B. Everhart
Attorney, Agent, or Firm—Leydig, Voit & Mayer

[57] ABSTRACT

A semiconductor substrate having first and second opposing surfaces is provided with a plurality of semiconductor elements having their electrodes arranged on the first surface. A plurality of small recesses are first formed in the second surface at locations opposite selected ones of the electrodes of the semiconductor elements. After the formation of the small recesses, the material of the substrate in and around the small recesses is etched away so that a larger recess encompassing the small recesses is formed and, at the same time, the small recesses are caused to extend through the substrate to thereby form through-holes which extend from the larger recess to the selected ones of the electrodes.

4 Claims, 3 Drawing Sheets

METHOD OF MAKING A SEMICONDUCTOR DEVICE INCLUDING VIA HOLES

The present invention relates to a "via-holed" semiconductor device which includes "via-holes" (also called through-holes) which are formed in a semiconductor substrate to extend therethrough and through which components formed on one surface of the semiconductor substrate are electrically connected to another surface of the substrate. The present invention relates also to a method of making such a semiconductor device.

BACKGROUND OF THE INVENTION

One example of a "via-holed" semiconductor device and method of making it is shown in FIGS. 1(a) through 1(d).

A plurality of semiconductor elements having source electrodes 2, drain electrodes 3 and gate electrodes 4, respectively, are formed on a front surface of a semiconductor substrate 1. Then, the semiconductor substrate 1 is thinned to a desired thickness by etching or grinding (or any other suitable technique) the substrate 1 from the opposing rear surface. Next, as shown in FIG. 1(a), a first resist coating 21 is used as a mask to etch a large recess 22 in a rear surface region corresponding to the semiconductor elements, particularly the source electrodes 2 in the illustrated example, of the respective semiconductor elements. After the formation of the recess 22, the first resist coating 21 is removed. Then, as shown in FIG. 1(b) and 1(c), a second resist coating 23 is formed, which coating 23 acts as a mask for etching the substrate 1 in the bottom of the recess 22 to form a through-hole 24 extending to each of the source electrodes 2. After that, the second resist coating 23 is removed. Finally, as shown in FIG. 1(d), the rear surface of the substrate 1, the inner surface of the recess 22 and the inner surface of each of the through-holes 24 are coated with a metal layer 25 so that the respective source electrodes 2 and the rear surface of the semiconductor substrate 1 are electrically interconnected.

Another example of conventional "via-holed" semiconductor devices is disclosed in Japanese Published Patent application 63-155673 published on June 28, 1988. The semiconductor device of this publication has a structure as shown in FIG. 2, which is fabricated by thinning a substrate 1 to a thickness on the order of 30 μm, forming individual stepped through-holes 30 one for each source electrode 2, and thereafter coating the inner surfaces of the through-holes 30 and the rear surface of the substrate 1 with a metal layer 31.

According to the conventional method of making a via-holed semiconductor device shown in FIG. 1, because the large recess 22 must be first formed by the first etching process before etching the through-holes 24, a large step D is formed between the rear surface of the substrate 1 and the bottom surface of the recess 22. That bottom substrate is coated with the second resist coating 23 acting as a mask for forming the through-holes 24. Because of this step D, it is difficult to form the second coating 23 with a uniform thickness. This step, furthermore, prevents accurate exposure of the second resist coating 23 to a pattern of radiation for patterning the coating 23.

As for the semiconductor device shown in FIG. 2, because the substrate 1 must be thinned to a small thickness on the order of 30 μm, there is a decrease in strength of the substrate and, when the device is a monolithic microwave integrated circuit device, an increase in transmission loss between microstrips. Further, since in the conventional semiconductor device of FIG. 2 the through-holes 30 are individually formed for each source electrode 2, the thermal resistance of the device is undesirably large.

Therefore, the object of the present invention is to eliminate the above-stated problems.

SUMMARY OF THE INVENTION

According to the present invention, a semiconductor substrate has a plurality of semiconductor elements having electrodes formed on a first surface thereof, and a plurality of small recesses formed in a second surface of the substrate at locations corresponding to those electrodes of the semiconductor elements for which through-holes are to be formed. The material of the substrate in and around the small recesses is etched away to form a single large recess which encompasses the small recesses and, at the same time, to cause the small recesses to extend through the substrate to thereby form a plurality of through-holes which extend from the bottom of the large recess to the said respective electrodes.

DETAILED DESCRIPTION OF THE INVENTION

Figure 1A:
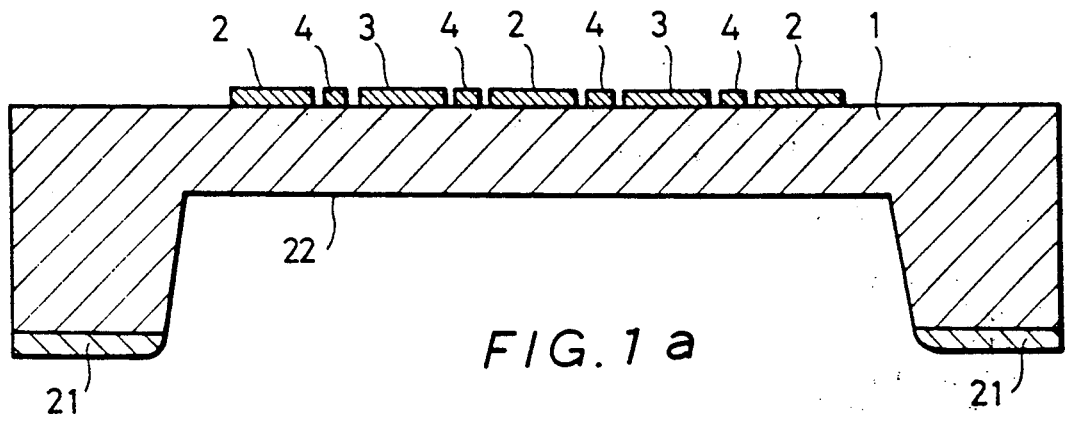
FIGS. 1(a) through 1(d) are cross-sectional views of a manufacturing process for a via-holed semiconductor device.
Figure 1B:
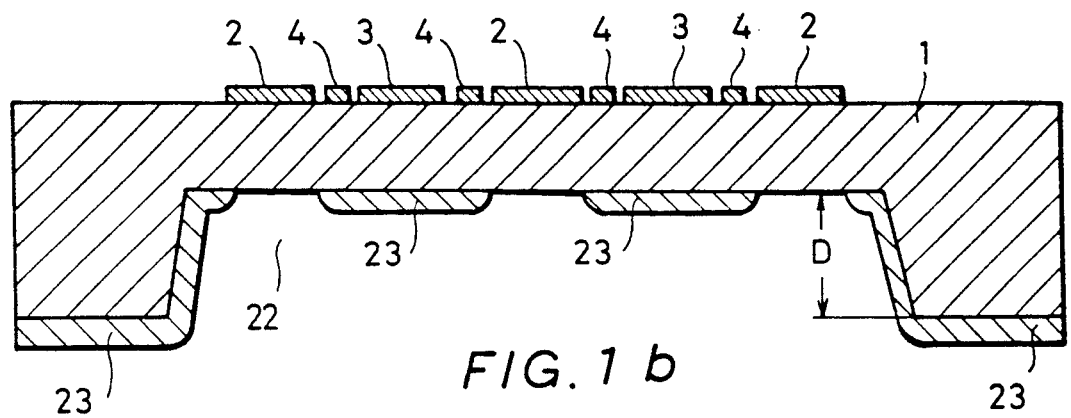
Figure 1C:
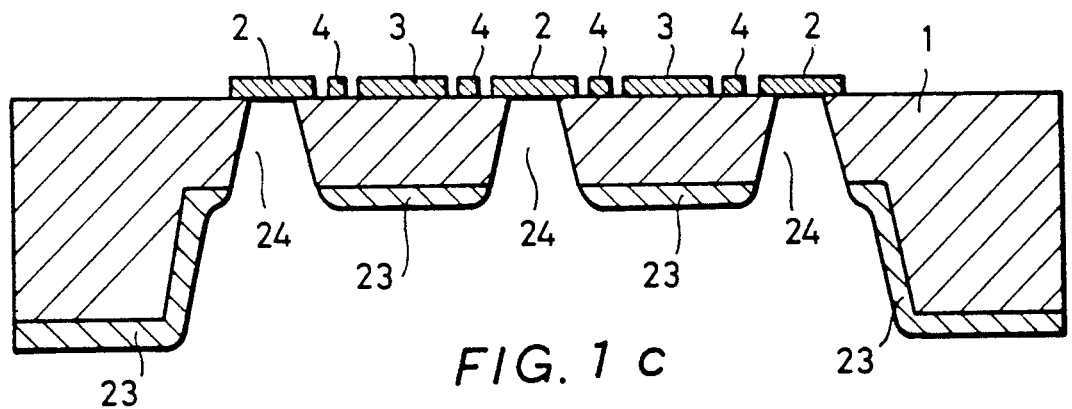
Figure 1D:
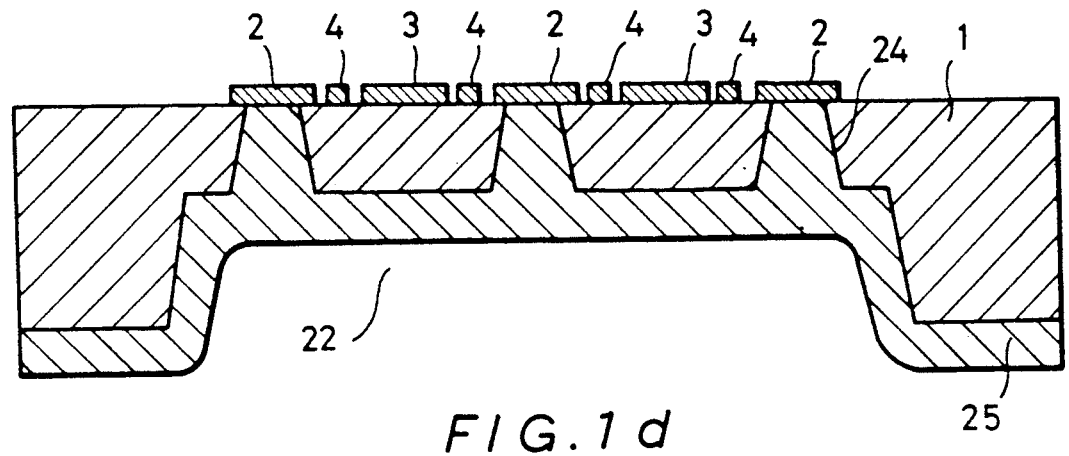
Figure 2:
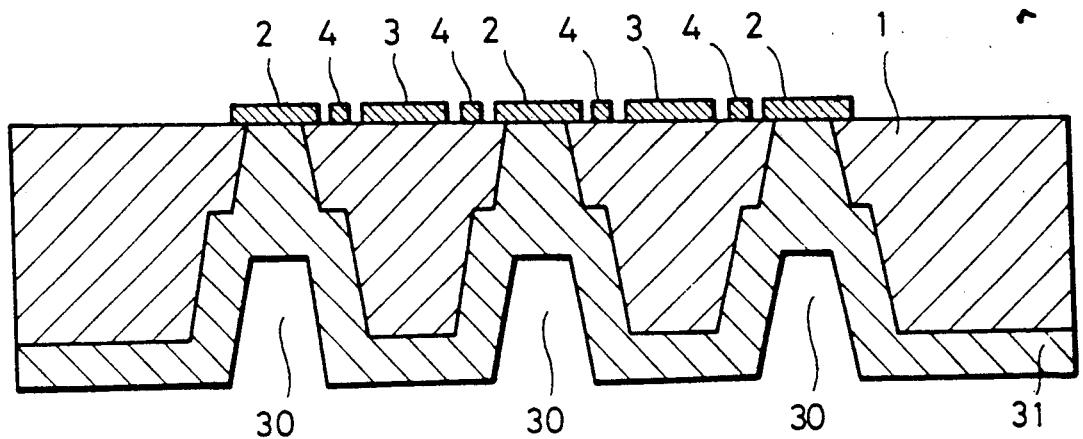
FIG. 2 is a cross-sectional view illustrating the structure of a conventional via-holed semiconductor device.

Referring to FIG. 3, a plurality of semiconductor elements with source electrodes 2, drain electrodes 3 and gate electrodes 4 are formed in an upper surface of a semiconductor substrate 1. Next, the semiconductor substrate 1 is thinned to a predetermined thickness (e.g. a thickness of more than 70 μm) by etching or grinding the substrate from an opposing bottom surface. (Any other suitable technique may be used for thinning the substrate.) Next, as shown in FIG. 3(a), a first resist coating 5 is formed on the bottom surface of the substrate 1, which acts as a mask for etching the substrate 1 from the bottom surface of the substrate 1 toward the upper surface. The etching forms small recesses 6 in the rear surface at locations opposite the respective source electrodes 2. After the formation of the small recesses 6, the first resist coating 5 is removed. Next, as shown in FIGS. 3(b) and 3(c), a second resist coating 7 is deposited and used as a mask to etch away the material of the substrate 1 in and around the small recesses 6. This etching results in the formation of a single large recess 8 in a region which encompasses the respective small recesses 6. This etching also causes the small recesses in the bottom surface to extend farther through the substrate so that a plurality of through-holes 9 are formed, which extend from the large recess 8 to the respective source electrodes 2. After that, the second resist coating 7 is removed.

Better results can be obtained if a dry-etching technique is used for forming the small recesses 6, the large recess 8 and the through-holes 9, because etching in the lateral direction is smaller in dry-etching technique than in wet etching.

Figure 3A:
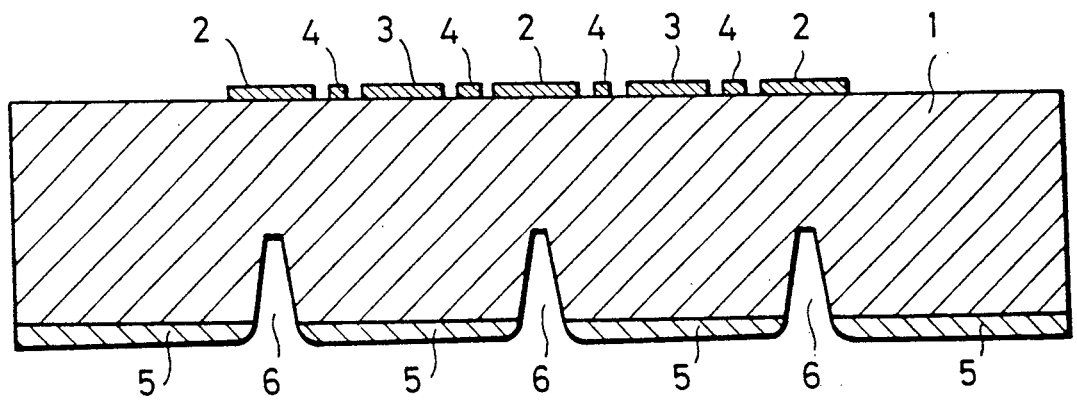
FIGS. 3(a) through 3(d) are cross-sectional views of a semiconductor device according to one embodiment of the present invention, for explaining various manufacturing steps.
Figure 3B:
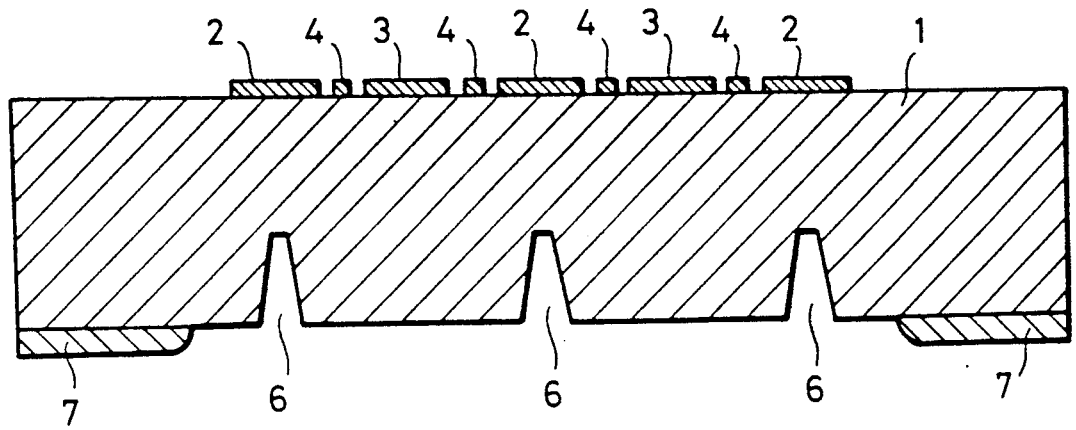
Figure 3C:
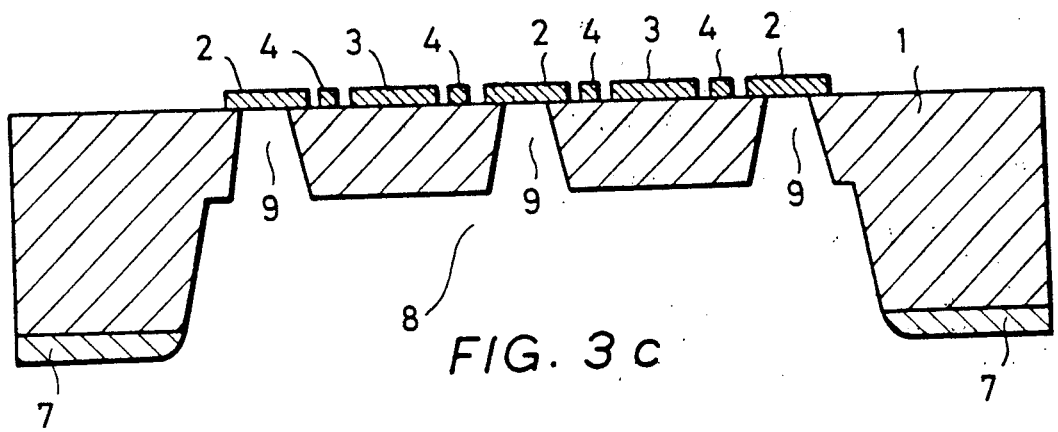
Figure 3D:
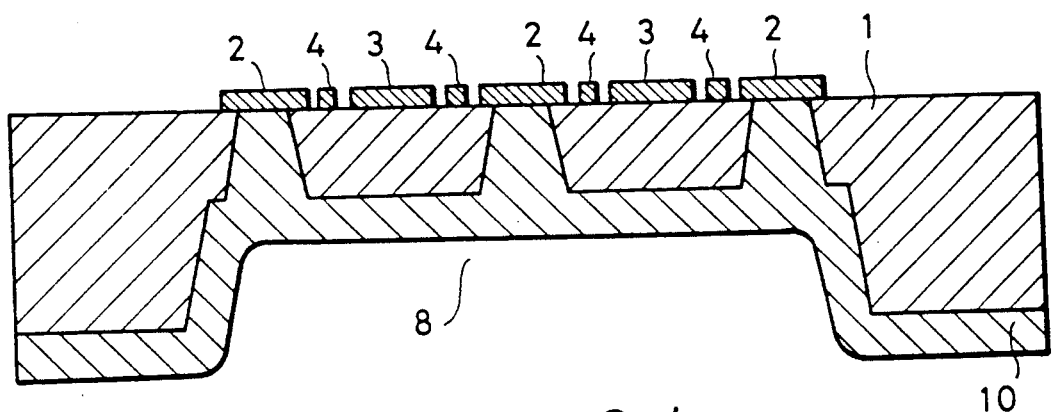

Finally, as shown in FIG. 3(d), a metallic layer 10 is formed by vapor-deposition, covering the bottom surface of the substrate 1, the inner surface in the large recess 8, and the inner surfaces of the respective through-holes 9 whereby the respective source electrodes 2 and the bottom surface of the semiconductor substrate 1 are electrically connected together.

Figure 4:
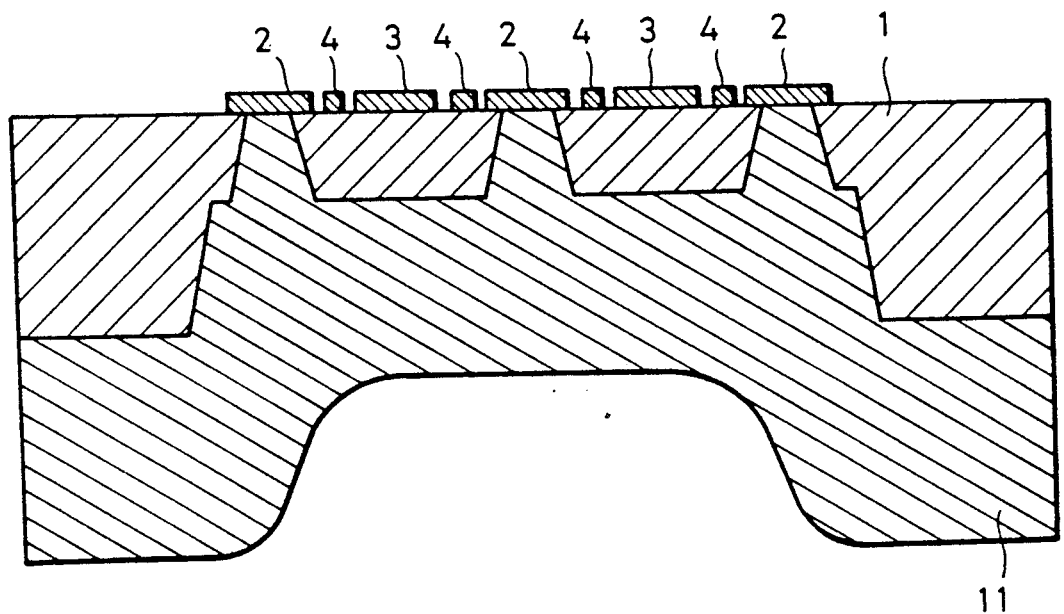
FIG. 4 is a cross-sectional view of a semiconductor device according to another embodiment of the present invention.

In place of the metallic layer 10 of FIG. 3, a metallic layer 11 shown in FIG. 4 may be formed by plating as a PHS (plated heat sink). When the structure shown in FIG. 4 is employed, reductions in the source inductances of the respective semiconductor elements and a reduction in the thermal resistance of the semiconductor device are achieved.

The present invention has been described by means of embodiments in which source electrodes of semiconductor elements are connected to a bottom surface of a semiconductor substrate by a metallic layer, but the electrodes are not limited to source electrodes.

What is claimed is:

1. A method of making a semiconductor device comprising:

forming a plurality of semiconductor elements in a semiconductor substrate at a first surface of said substrate;

forming electrodes contacting said semiconductor elements on said first surface of said semiconductor substrate;

forming a plurality of relatively small recesses by etching a second surface of said substrate opposite said first surface at locations opposite selected ones of said electrodes;

removing by etching the material of said substrate in and around said small recesses to form a single, relatively large recess encompassing said small recesses including a third surface intermediate said first and second surfaces and, at the same time, further etching in said plurality of small recesses to extend the small recesses through said substrate to form through-holes which extend from said third surface in said large recess to said selected ones of said electrodes; and coating said larger recess, the inner surfaces of said through-holes, and said second and third surfaces of said semiconductor substrate with a continuous metallic layer.

2. The method according to claim 1 including forming said continuous metallic layer by plating so that said continuous metallic layer is a plated heat sink.

3. A method of making a semiconductor device comprising:

forming a plurality of semiconductor elements in a semiconductor substrate at a first surface of said substrate;

forming electrodes contacting said semiconductor elements on said first surface of said semiconductor substrate;

forming a plurality of relatively small recesses in a second surface of said substrate opposite said first surface at locations opposite selected ones of said electrodes;

removing the material of said substrate in and around said small recesses to form a single, relatively large recess encompassing said small recesses including a third surface intermediate said first and second surfaces and, at the same time, further removing material in said plurality of small recesses to extend the small recesses through said substrate to form through-holes which extend from said third surface in said large recess to said selected ones of said electrodes; and coating said large recess, the inner surfaces of said through-holes, and said second and third surfaces of said semiconductor substrate with a continuous metallic layer.

4. The method according to claim 5 including forming said continuous metallic layer by plating so that said continuous metallic layer is a plated heat sink.

* * * * *